(12) United States Patent
Lee

(10) Patent No.: US 8,089,087 B2
(45) Date of Patent: Jan. 3, 2012

(54) LIGHT EMITTING DEVICE PACKAGE

(75) Inventor: Sang Youl Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/621,292

(22) Filed: Nov. 18, 2009

(65) Prior Publication Data

US 2010/0123154 A1 May 20, 2010

(30) Foreign Application Priority Data

Nov. 18, 2008 (KR) .................. 10-2008-0114615

(51) Int. Cl.
*H01L 33/00* (2010.01)
(52) U.S. Cl. ...... 257/98; 257/99; 257/100; 257/E33.067
(58) Field of Classification Search ............. 257/98, 257/99, 100, E33.067
See application file for complete search history.

(56) References Cited

U.S. PATENT DOCUMENTS

| 7,030,423 B2* | 4/2006 | Chang et al. ............. 257/98 |
| 2003/0219919 A1* | 11/2003 | Wang et al. ............. 438/26 |
| 2005/0067628 A1* | 3/2005 | Kuwabara et al. ......... 257/98 |

FOREIGN PATENT DOCUMENTS

| CN | 1378292 A | 11/2002 |
| CN | 1601777 A | 3/2005 |
| JP | 2003-163379 A | 6/2003 |
| JP | 2005-056941 A | 3/2005 |

OTHER PUBLICATIONS

Notice of Allowance dated May 30, 2011 in Korean Application No. 10-2008-0114615, filed Nov. 18, 2008.

* cited by examiner

*Primary Examiner* — Long Pham
(74) *Attorney, Agent, or Firm* — Saliwanchik, Lloyd & Eisenschenk

(57) ABSTRACT

A light emitting device package is provided. The light emitting device package comprises a package body, a light emitting device on the package body, and a light-transmitting light guide member under the light emitting device.

19 Claims, 8 Drawing Sheets

US 8,089,087 B2

LIGHT EMITTING DEVICE PACKAGE

CROSS-REFERENCE TO RELATED APPLICATION

This application claims the benefit under 35 U.S.C. §119 of Korean Patent Application No. 10-2008-0114615, filed Nov. 18, 2008, which is hereby incorporated by reference in its entirety.

BACKGROUND

The present disclosure relates to a light emitting device package.

Group III-V nitride semiconductors have been widely used as the core materials of light emitting devices, such as Light Emitting Diodes (LED) and Laser Diodes (LD), for their physical and chemical characteristics. The group III-V nitride semiconductors typically consist of semiconductor materials having the composition equation of $In_xAl_yGa_{1-x-y}N$ (where $0 \leq x \leq 1$, $0 \leq y \leq 1$, and $0 \leq x+y \leq 1$).

The LED is a type of semiconductor device that changes electricity into infrared rays or light by using the characteristics of compound semiconductors to input/output a signal, or is used as a light source.

The LED or the LD with nitride semiconductor materials is often applied as the light emitting devices for obtaining light. For example, the LED or the LD is applied as the light sources of all sorts of products such as the light emitting portions of the key pads of cellular phones, electronic display boards, and lighting devices.

BRIEF SUMMARY

Embodiments provide a light emitting device package, which disposes a light guide member under a light emitting device, thereby improving light extraction efficiency.

Embodiments provide a light emitting device package, which comprises a light guide member between a package body and a light emitting device.

Embodiments provide a light emitting device package, which comprises a light guide member and a lead electrode under a light emitting device.

An embodiment provides a light emitting device package comprising: a package body; a light emitting device on the package body; and a light-transmitting light guide member under the light emitting device.

An embodiment provides a light emitting device package comprising: a package body comprising a cavity; a light emitting device at the cavity; at least one lead electrode under the light emitting device; at least one light guide member under the light emitting device; and a resin material at the cavity.

An embodiment provides a light emitting device package comprising: a package body; a light emitting device on the package body; at least one lead electrode electrically connected to the light emitting device; an adhesion part under the light emitting device; and a light guide member between the lead electrode and the adhesion part.

An embodiment provides a light emitting device package comprising: a package body comprising a cavity; a light emitting device at the cavity; at least one lead electrode under the light emitting device; and a light guide member disposed under perimeter of the light emitting device.

The details of one or more embodiments are set forth in the accompanying drawings and the description below. Other features will be apparent from the description and drawings, and from the claims.

DETAILED DESCRIPTION

Reference will now be made in detail to embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

Figure 1:
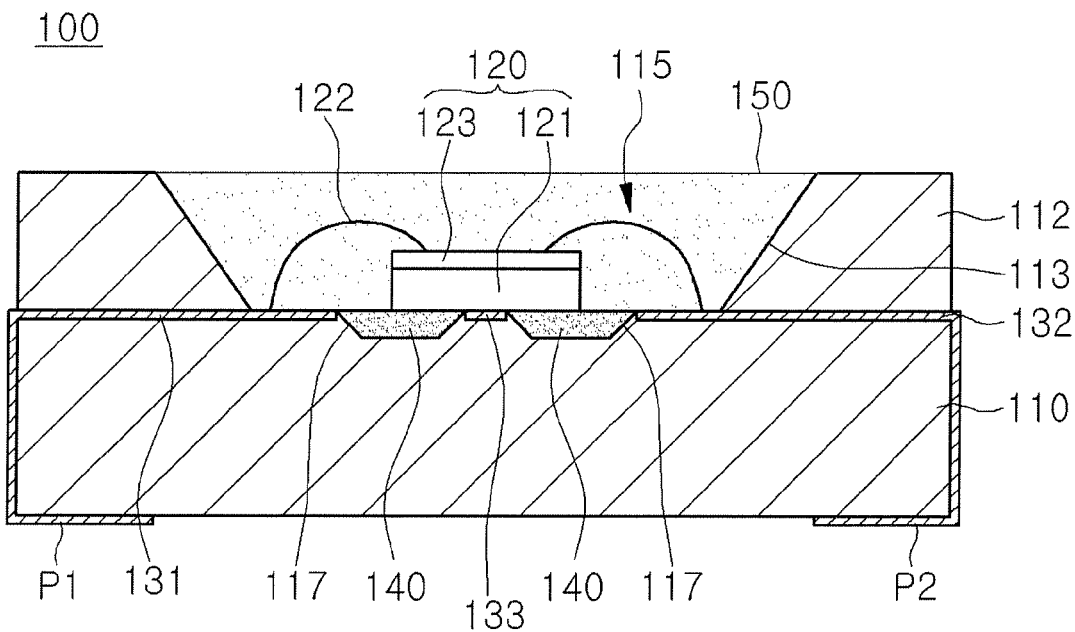
FIG. 1 is a side-sectional view illustrating a light emitting device package according to a first embodiment.
Figure 2:
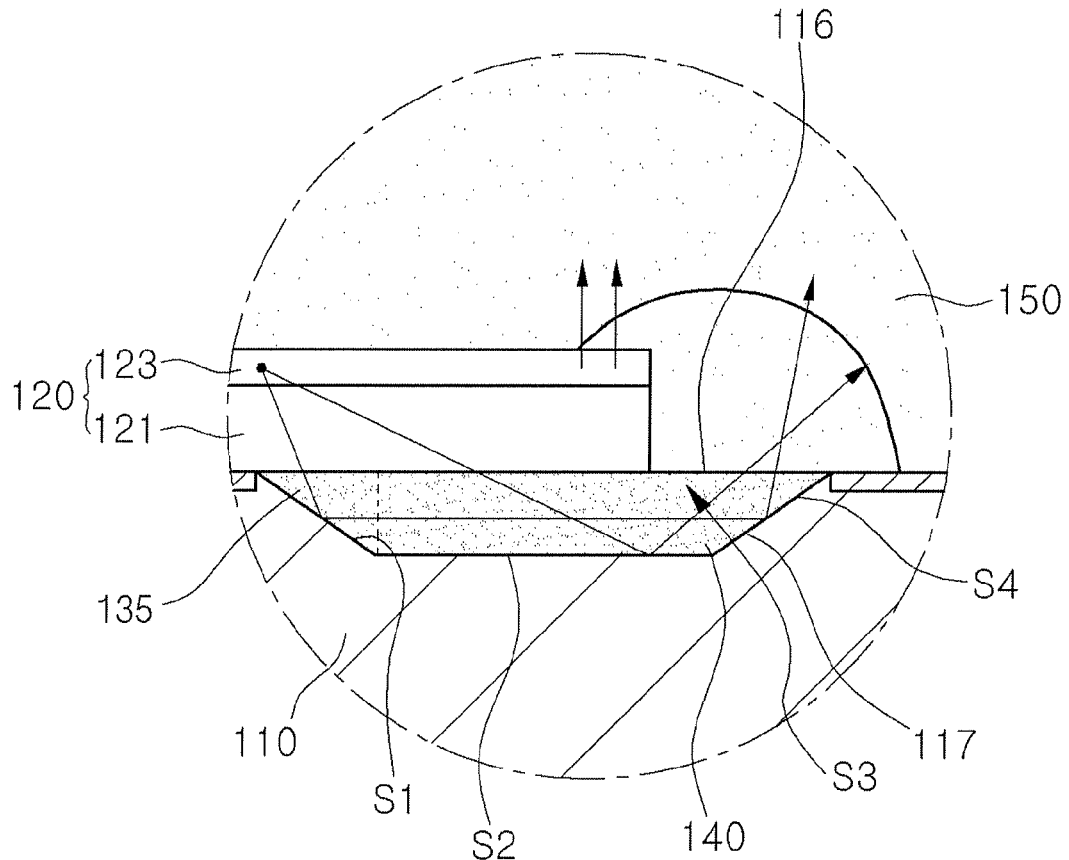
FIG. 2 is a diagram illustrating an example of light extraction with a light guide member of FIG. 1.

FIG. 1 is a side-sectional view illustrating a light emitting device package according to a first embodiment. FIG. 2 is a diagram illustrating an example of light extraction with a light guide member of FIG. 1.

Referring to FIGS. 1 and 2, a light emitting device package 100 includes a package body 110, a cavity 115, lead electrodes 131 and 132, a light guide member 140, and a resin material 150.

The package body 110 may include a resin material (for example, polycarbonate (PC) and polyphthalamide (PPA)), a ceramic material or a silicon material. The package body 110 may include an injection molding structure or a stacked structure. The package body 110 may include a resin material with a reflecting ratio more than 70%.

The lead electrodes 131 and 132 are formed at the package body 110. The lead electrodes 131 and 132 may be formed in at least one of a printed circuit board (PCB) type, a ceramic type, a lead frame type and a through hole type.

In embodiments, for convenience, the lead frame type will be exemplified below. The package body 110 may be injection-molded in integration with an upper portion 112 thereof, or may be coupled with an upper portion 112 in a separate stacked structure.

The cavity 115 having a certain depth is formed at the upper portion 112 of the package body 110. The cavity 115 has an opened upper side. The surface shape of the cavity 115 may be a circle, a polygon, or other shapes; and the cavity 115 may be formed in a single-layer structure or a multi-layer structure, but it is not limited thereto. The perimeter of the cavity 115 may be formed to be vertical or to be inclined with respect to the bottom of the cavity 115. The cavity 115 is not formed at the package body 110, which may be formed to have a flat surface.

One end of each of the lead electrodes 131 and 132 is disposed at the cavity 115. The lead electrodes 131 and 132 are separated from each other and are electrically opened.

The light emitting device 120 may be attached onto the first electrode 131 and/or second electrode 132. The light emitting device 120 may be attached on an adhesion part 133 of the first lead electrode 131. The light emitting device 120 and the lead electrodes 131 and 132 may be electrically connected through a wire 122. The light emitting device 120 may be connected to the lead electrodes 131 and 132 by selectively using die bonding, wire bonding or flip bonding.

Outer ends P1 and P2 of the lead electrodes 131 and 132 may be exposed at the outer side of the package body 110 in an electrode type, or may be extended to a portion of a rear surface or a bottom along the outer side of the package body 110. Moreover, a through hole or via-hole may be included in the package body 110.

The light emitting device 120 may include a blue LED chip, another colored LED chip or an ultraviolet (UV) LED chip and at least one of these may be included in the cavity 115, but it is not limited thereto.

The light emitting device 120 may include the stacked structure of a substrate 121 and a light emitting structure 123. For example, the substrate 121 may be formed of any one of sapphire ($Al_2O_3$), silicon carbide (SiC), silicon (Si), gallium arsenide (GaAs), gallium nitride (GaN), zinc oxide (ZnO), gallium phosphide (GaP) and indium phosphide (InP). In embodiments, among the above-described examples, a light-transmitting substrate may be used. The light emitting structure 123 includes at least one of the group III-V compound semiconductors, and is formed in any one of an N-P junction structure, a P-N junction structure, an N-P-N junction structure and a P-N-P junction structure. The light emitting structure 123 radiates light having a certain wavelength.

Another substrate or a semiconductor layer instead of the substrate 121 may be disposed under the light emitting device 120, but it is not limited thereto.

In the light emitting device 120, the light guide member 140 and the adhesion part 133 are disposed under the substrate 121. The substrate 121 and the light guide member 140 may be formed of the same material or materials having a small refraction index difference. Accordingly, light that is radiated through the light emitting structure 123 may be incident to the light guide member 140 via the substrate 121, pass through the light guide member 140, and be radiated through the outer side of the light emitting device 120. The light guide member 140 may be formed of a material with a reflection index less than 2.

The light guide member 140 is formed at the cavity 115. One side of the light guide member 140 is disposed under the light emitting device 120, and another side of the light guide member 140 is disposed to the outside of the perimeter of the light emitting device 120.

At least one groove 117 may be formed at the cavity 115. The groove 117 may be formed to have a certain depth from the bottom 116 (shown in FIG. 2) of the cavity 115. The depth of the groove 117 may be formed to be greater than the thicknesses of the lead electrodes 131 and 132.

The groove 117 may be formed to be connected from an inner side to an outer side with respect to the under perimeter of the light emitting device 120, this may be formed in a shape and a pattern for extracting inner light to an outside.

The groove 117 may be formed at the inner side or one side of each of the lead electrodes 131 and 132, but it is not limited thereto.

The light guide member 140 is formed at the groove 117. The light guide member 140 may be formed in a shape and a pattern corresponding to the groove 117. The groove 117, for example, may be formed in a circle shape, a polygon shape (for example, a diamond shape and a trapezoid shape), a stripe shape, a lens shape or a random shape. The light guide member 140, for example, may be formed in a polygon shape (for example, a tetragonal shape), a circle shape or a stripe shape. However, the shape of the groove 117 is not limited to the above-described shapes. A surface of the groove is coated with a reflection material (for example, silver (Ag), aluminum (Al)).

An inner side of the light guide member 140 may be formed at a lower portion of the light emitting device 120 or the entire lower region of the light emitting device 120, and an outer side of the light guide member 140 is exposed at the perimeter of the light emitting device 120. In this case, the outer side of the light guide member 140 may be formed to project further than the groove 117, but it is not limited thereto.

The light guide member 140 may be formed in one or plurality. The surface shape of the pattern may be formed in a polygon shape (for example, a tetragonal shape), a circle shape, a stripe shape or a random shape.

The cross-sectional surface of the light guide member 140 may be formed in a polygon shape (for example, a diamond shape and a trapezoid shape) or a concave-lens shape. In the light guide member 140, side surfaces S1 and S4 may be formed to be inclined at a certain angle $\theta 1$ with respect to a bottom S2 or to have a certain curvature. The top S3 of the light guide member 140 may be formed in the same plane as the cavity bottom 116 of the package body 110, or may be formed to higher than the cavity bottom 116 of the package body 110.

The light guide member 140 may be formed of a material having a small refraction index difference with respect to the substrate 121 of the light emitting device 120, a GaN-based material, or a material having a refraction index smaller than that of the substrate 121. The light guide member 140 may use a material having light-transmitting characteristic and a material having a high heat-radiating characteristic.

The light guide member 140, for example, may be selectively formed of at least one of oxide layers such as silicon dioxide ($SiO_2$), $Al_2O_3$, titanium dioxide ($TiO_2$), titanium oxide ($TiO_3$), ZnO-based materials and Transparent Conducting Oxide (TCO)-based materials, polymer-based materials, polymer compound materials, and glass material. The TCO-based material includes indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO).

The resin material 150 or a resin material to which a phosphor is added is formed at the cavity 115. The resin material 150 includes a silicon material or an epoxy material. When the light emitting device 120 is a blue LED chip, the phosphor which radiates yellow light may be added. The phosphor may be changed into another phosphor according to the kind of a chip.

When an external power source is supplied through the lead electrodes 131 and 132, the light emitting device 120 radiates light. At this point, the radiated light is radiated in all the directions of the light emitting device 120, and a portion of the radiated light travels through the substrate 121 of the light emitting device 120.

Light, which travels to the substrate 121 of the light emitting device 120, passes through the substrate 121 and is incident to the light guide member 140 that is disposed under the light emitting device 120. At this point, light incident to the light guide member 140 is reflected by the side surfaces S1 and S4 and bottom S2 of the light guide member 140. Herein, the side surfaces S1 and S4 and bottom S2 of the light guide member 140 are contacted with the groove 117, and reflect light incident to the light guide member 140. Because the reflection angle of light that is reflected by the light guide member 140 is changed by slope surfaces such as the side surfaces S1 and S4 of the groove 117, the reflected light may be radiated to the outside of the light emitting device 120. Accordingly, the light extraction efficiency of the light emitting device package 100 can be improved. Moreover, the light guide member 140 changes the critical angle of the reflected light, and thus can radiate the reflected light to the outside.

Heat that is produced from the light emitting device 120 may be radiated through the light guide member 140, or may be radiated through the adhesion part 133 that contacts the lower portion of the light emitting device 140. Moreover, the adhesion part 133 may be integrally connected to the first lead electrode 131 and thereby radiate heat through the lower portion of the package body 110. Alternatively, the adhesion part 133 may be formed in a through hole and thereby radiate heat through the lower portion of the package body 110.

Figure 3:
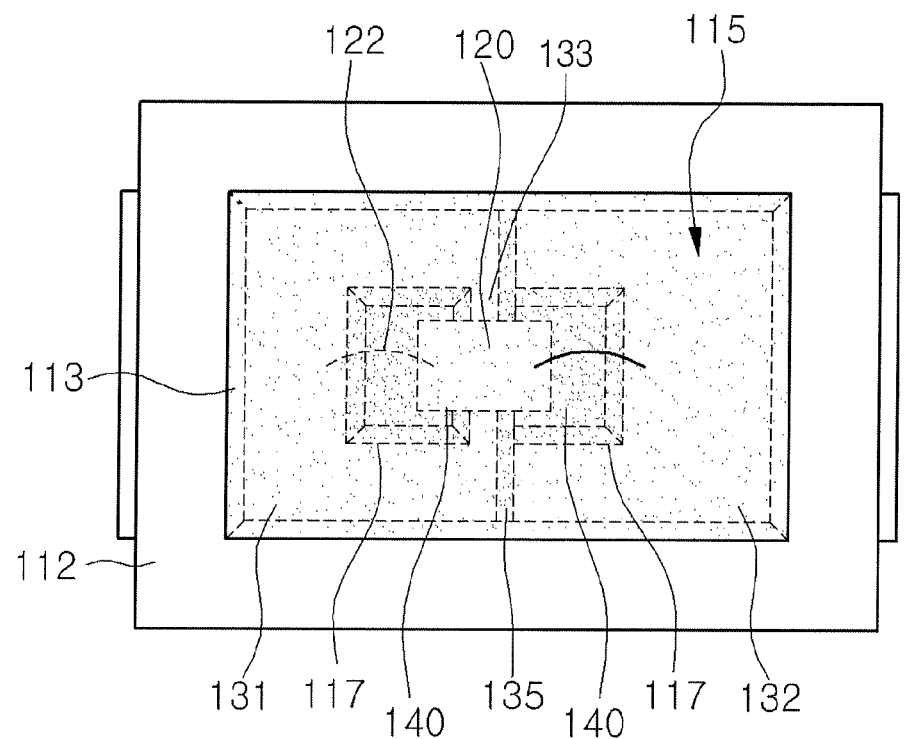
FIG. 3 is a plan view illustrating the light emitting device package of FIG. 1.

FIG. 3 is a plan view illustrating the light emitting device package of FIG. 1.

Referring to FIG. 3, a plurality of light guide members 140 is disposed at the bottom of the cavity 115 of the package body 110. The light emitting device 120 is attached onto the light guide member 140.

The light guide member 140 may be formed at the inside or one side of each of the lead electrodes 131 and 132. A separation part 135 may be disposed between the lead electrodes 131 and 132. If the light guide member 140 is a dielectric material (for example, $SiO_2$), the separation part 135 may be formed with the light guide member 140, or may be formed of the same material as that of the package body 110.

The light guide member 140 is disposed under the light emitting device 120 and guides light (which travels to the bottom of the light emitting device 120) to the outer side of the light emitting device 120, thereby extracting the light.

Figure 4:
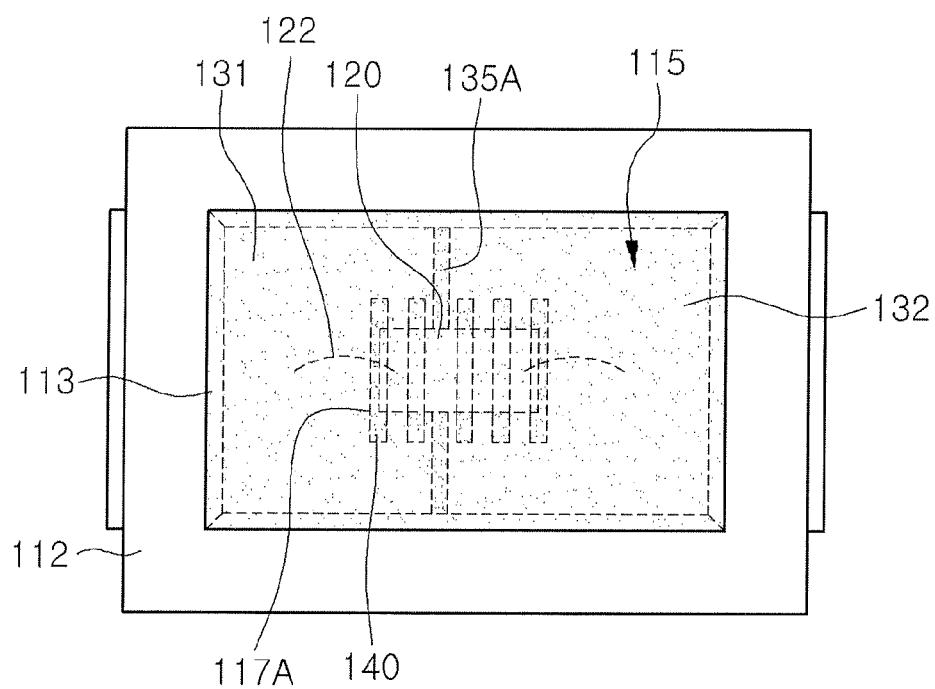
FIG. 4 is a plan view illustrating a light emitting device package according to a second embodiment.

FIG. 4 is a plan view illustrating a light emitting device package according to a second embodiment. In the description of the second embodiment, the same elements as those of the first embodiment will be indicated as the same reference numbers as those of the first embodiment; and repetitive description will be omitted.

Referring to FIG. 4, a light emitting device package 100A includes a stripe-type light guide member 140 and a groove 117A.

The groove 117A is formed in plurality. The plurality of grooves 117A is formed in a stripe-type in which they are arrayed at the bottom of the cavity 115 at certain distances. The stripe-type groove 117A may be formed in a slope structure in which its perimeter surface is inclined, easily extracting light.

The groove 117A may be formed at the lead electrodes 131 and 132, and may be formed to be thicker than the thickness of the lead electrode 131.

The light emitting device 120 is attached onto the light guide member 140 and the lead electrodes 131 and 132. Light, which is radiated through the lower portion (i.e., a substrate) of the light emitting device 120, may be incident to the light guide member 140 and be radiated to the outside. The separation part 135A may be formed between the light guide members 140. The separation part 135A may be formed between the lead electrodes 131 and 132. The separation part 135A may be formed in the package body, the light guide member 140, or a dielectric material (for example, $SiO_2$).

Figure 5:
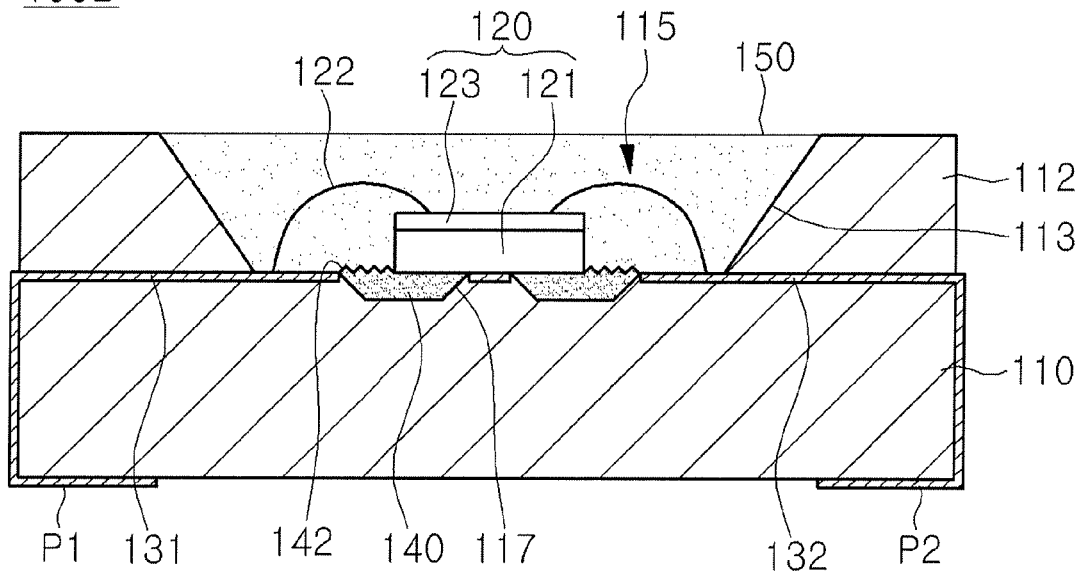
FIG. 5 is a side-sectional view illustrating a light emitting device package according to a third embodiment.

FIG. 5 is a side-sectional view illustrating a light emitting device package according to a third embodiment. In the description of the third embodiment, the same elements as those of the first embodiment will be indicated as the same reference numbers as those of the first embodiment; and repetitive description will be omitted.

Referring to FIG. 5, a light emitting device package 100B includes a light guide member 140 having a roughness 142.

When light incident to the light guide member 140 is reflected and radiated to the outside, the roughness 142 of the light guide member 140 changes the critical angle, improving light extraction efficiency.

Moreover, the roughness 142 of the light guide member 140 may be formed at the outer-side top (i.e., the outer side of the light emitting device) of the light guide member 140 or the entire top of the light guide member 140. The roughness 142 of the light guide member 140 may be formed to be thinner than a thickness of the substrate 121.

A roughness (not shown) may be formed at the bottom and/or side surface of the groove 117, and thus, a roughness may also be formed at the bottom and/or side surface of the light guide member 140.

Figure 6:
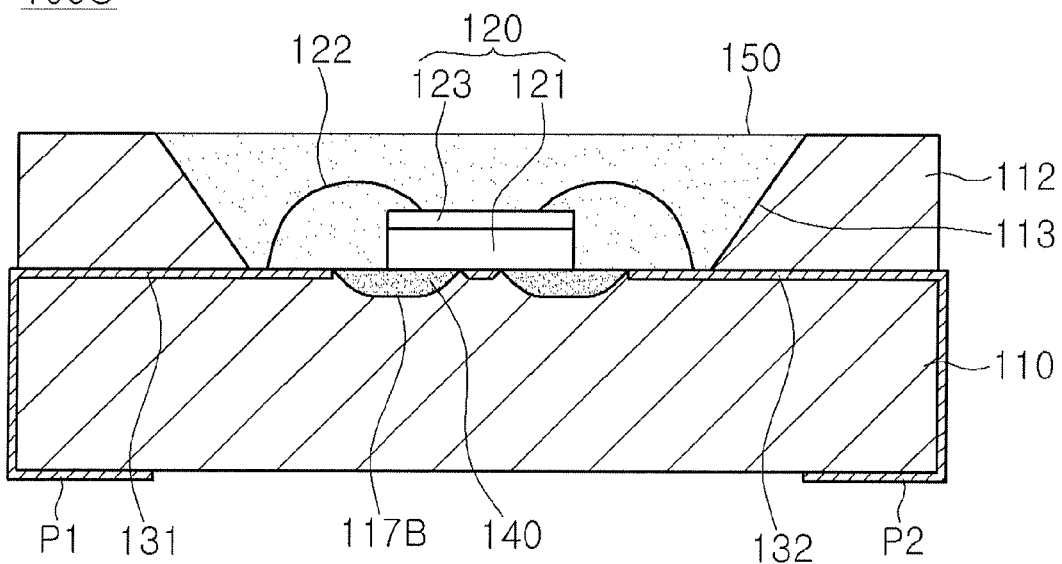
FIG. 6 is a side-sectional view illustrating a light emitting device package according to a fourth embodiment.

FIG. 6 is a side-sectional view illustrating a light emitting device package according to a fourth embodiment. In the description of the fourth embodiment, the same elements as those of the first embodiment will be indicated as the same reference numbers as those of the first embodiment; and repetitive description will be omitted.

Referring to FIG. 6, in a light emitting device package 100C, the light guide member 140 may be formed in a concave-lens shape in which its side-sectional surface is concave. The concave-lens shape of light guide member 140 may be formed by a concave-lens shape of groove 117B. Since the function of the light guide member 140 is the same as or similar to that of the first embodiment, its detailed description refers to that of the first embodiment.

Figure 7:
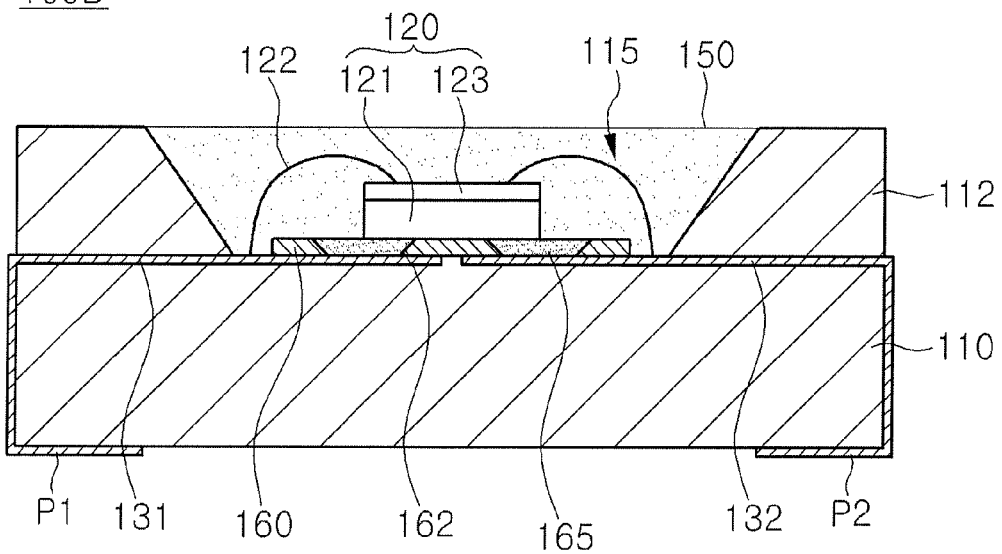
FIG. 7 is a side-sectional view illustrating a light emitting device package according to a fifth embodiment.

FIG. 7 is a side-sectional view illustrating a light emitting device package according to a fifth embodiment. In the description of the fifth embodiment, the same elements as those of the first embodiment will be indicated as the same reference numbers as those of the first embodiment; and repetitive description will be omitted.

Referring to FIG. 7, a light emitting device package 100D may include a sub substrate 160 on the lead electrodes 131 and 132 disposed in the cavity 115 of the package body 110.

In the package body 110, the lead electrodes 131 and 132 are formed at the bottom of the cavity 115, and the sub substrate 160 is formed on the lead electrodes 131 and 132. The light emitting device 120 is attached onto the sub substrate 160.

The sub substrate 160 may be formed of a dielectric material in which light transmission is good, for example, a sapphire substrate ($Al_2O_3$), a glass material substrate, or an oxide-layer material, and may also be formed of a material in which a heat-radiating characteristic is good.

Moreover, at least one guide hole 162 or a groove may be formed in the sub substrate 160. In the guide hole 162, a material in which a refraction index difference is small with respect to the substrate 121 of the light emitting device 120, a light-transmitting material, or a material in which a heat-radiating characteristic is good, may be selectively formed. For example, an oxide layer such as $SiO_2$, $Al_2O_3$, $TiO_2$, $TiO_3$, ZnO-based material and TCO-based material, polymer-based material, or polymer compound materials may be selectively formed. The TCO-based material includes ITO, IZO, IZTO, IAZO, IGZO, IGTO, AZO and ATO.

A light guide member 165 may be molded at the guide hole 162, and the sub substrate 160 may be attached to the cavity bottom. Alternatively, the sub substrate 160 is attached to the cavity bottom, and the light guide member 165 is molded at the guide hole 162.

The sub substrate 160 forms the groove 117 (shown in FIG. 1) independently of the package body 110, or attaches the sub substrate 160 to the cavity bottom without performing a process that molds the guide member in the cavity like in FIG. 1, thereby improving light extraction efficiency at the lower portion of the light emitting device 120. In the fifth embodiment, moreover, the upper portion 112 including the cavity 115 may be not formed on the package body 110, but it is not limited thereto.

Figure 8:
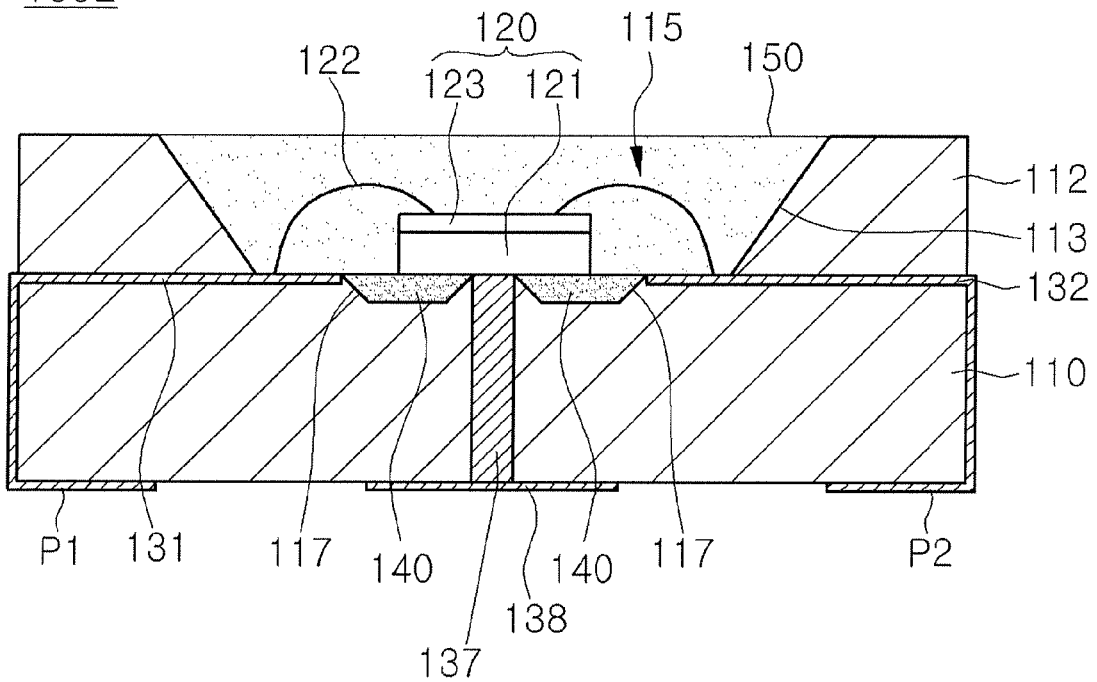
FIG. 8 is a side-sectional view illustrating a light emitting device package according to a sixth embodiment.

FIG. 8 is a side-sectional view illustrating a light emitting device package according to a sixth embodiment. In the description of the sixth embodiment, the same elements as those of the above embodiments will be indicated as the same reference numbers as those of the above embodiments, and repetitive description will be omitted.

Referring to FIG. 8, a light emitting device package 100E may include a through hole 137 and a radiation plate 138.

The through hole 137 may be formed in one or plurality. The through hole 137 is formed with a metal material or a material having a high heat-radiating characteristic. The through hole 137 is disposed under the light emitting device 120 and formed in the package body 110. The through hole 137 may be connected to the lower portion of the light emitting device 140.

The radiation plate 138 is disposed under the package body 110 and is connected to one end of the through hole 137. The radiation plate 138 may be separated from the lead electrodes 131 and 132. The through hole 137 and the radiation plate 138 may be provided as an electrode.

Heat that is produced from the light emitting device 120 may be radiated through the light guide member 140 and the through hole 137 that contacts the lower portion of the light emitting device 140. Moreover, the radiation plate 138 may be connected to the through hole 137 and thereby radiate heat through the lower portion of the package body 110.

Figure 9:
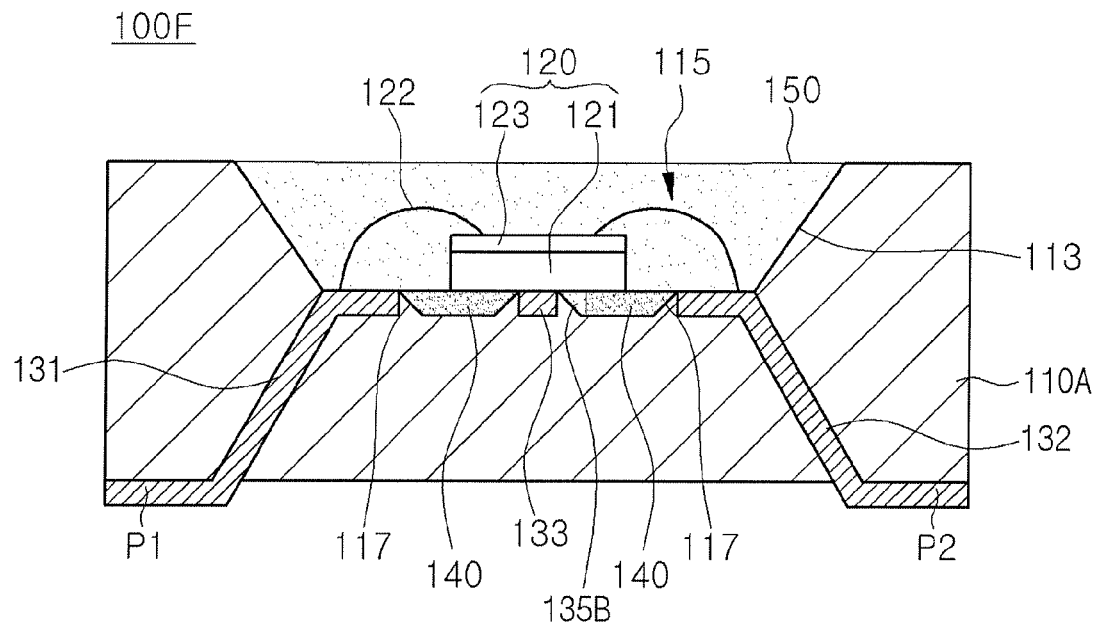
FIG. 9 is a side-sectional view illustrating a light emitting device package according to a seventh embodiment.

FIG. 9 is a side-sectional view illustrating a light emitting device package according to a seventh embodiment. In the description of the seventh embodiment, the same elements as those of the above embodiments will be indicated as the same reference numbers as those of the above embodiments, and repetitive description will be omitted.

Referring to FIG. 9, a light emitting device package 100F may include lead electrodes 131 and 132 formed in a slug-type.

The package body 110A has a cavity 115 having an opened upper side.

The lead electrodes 131 and 132 may have a portion disposed within the cavity 115. The other ends P1 and P2 of the lead electrodes 131 and 132 are disposed on the bottom surface of the package body 110A. The lead electrodes 131 and 132 are penetrated from a bottom surface of the cavity 115 to the bottom surface of the package body 110A.

The groove 117 may be formed to have a certain depth from the bottom surface of the cavity 115. The depth of the groove 117 may be formed to be greater than the thicknesses of the lead electrodes 131 and 132.

The groove 117 may be formed to be connected from an inner side to an outer side with respect to the under perimeter of the light emitting device 120. This may be formed in a shape and a pattern for extracting inner light to an outside.

The groove 117 may be formed at the inner side or one side of each of the lead electrodes 131 and 132, but it is not limited thereto.

The light guide member 140 is formed at the groove 117. The light guide member 140 may be formed in a shape and a pattern corresponding to the groove 117. The inner side of the light guide member 140 may be formed at a lower portion of the light emitting device 120 or the entire lower region of the light emitting device 120, and the outer side of the light guide member 140 is exposed at the perimeter of the light emitting device 120. One of the grooves 117 has a separation part 135B formed of a different material (for example, $SiO_2$) from the light guide member 140. The light guide member 140 is formed of Transparent Conducting Oxide (TCO)-based materials.

Figure 10:
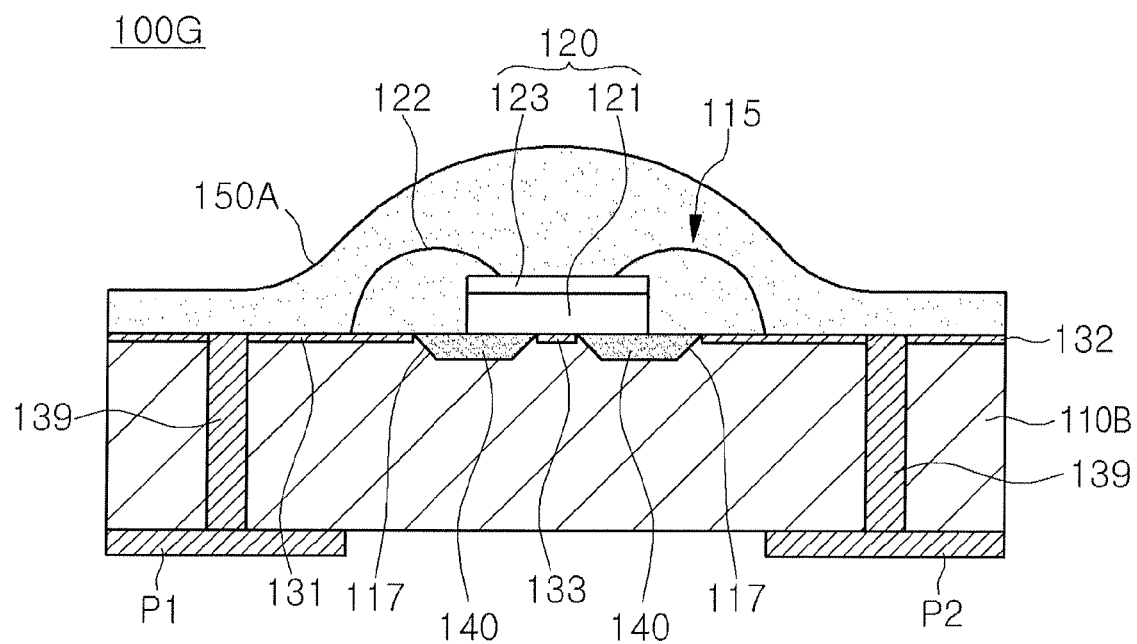
FIG. 10 is a side-sectional view illustrating a light emitting device package according to an eighth embodiment.

FIG. 10 is a side-sectional view illustrating a light emitting device package according to an eighth embodiment. In the description of the eighth embodiment, the same elements as those of the above embodiments will be indicated as the same reference numbers as those of the above embodiments, and repetitive description will be omitted.

Referring to FIG. 10, a light emitting device package 100G may include a resin material 150A formed on the package body 110B and lead electrodes 131 and 132 connected to a through hole 139.

The resin material 150A is disposed entirely on the package body 110B. A portion of the resin material 150A may be formed of a convex lens shape on the light emitting device 120. The resin material 150A may contain a phosphor.

The lead electrodes 131 and 132 are connected to the through hole 139. The through hole 139 is connected to outer ends P1 and P2 formed on the bottom surface of the package body 110B.

Figure 11:
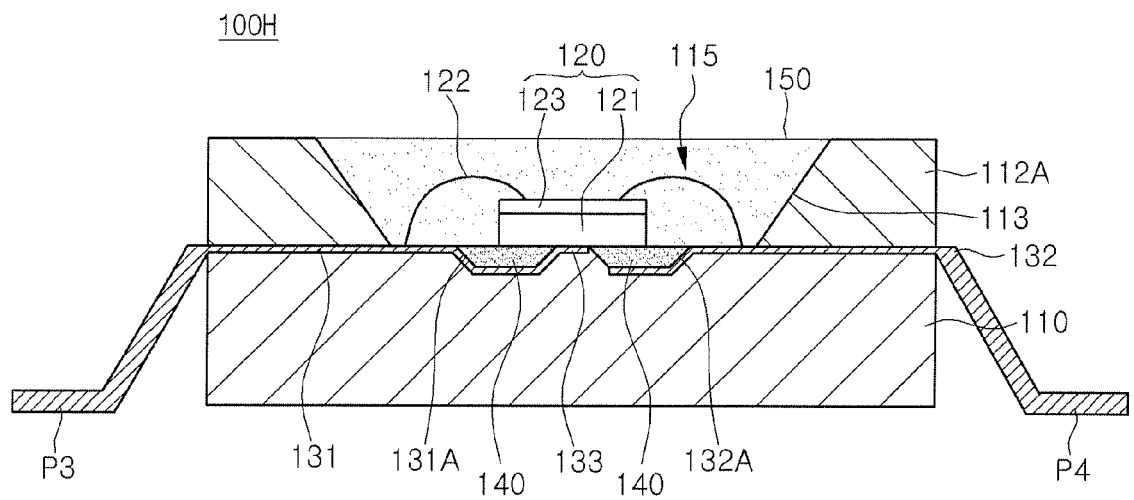
FIG. 11 is a side-sectional view illustrating a light emitting device package according to a ninth embodiment.

FIG. 11 is a side-sectional view illustrating a light emitting device package according to a ninth embodiment. In the description of the ninth embodiment, the same elements as those of the above embodiments will be indicated as the same reference numbers as those of the above embodiments, and repetitive description will be omitted.

Referring to FIG. 11, a light emitting device package 100H may include lead electrodes 131 and 132 protruding toward the outer side of the package body 110.

Outer ends P3 and P4 of the lead electrodes 131 and 132 may be formed to project from the outer side of the package body 110 and have a smoothly bent or curved shape.

Inner ends 131A and 132A of the lead electrodes 131 and 132 have at least one groove formed to have a certain depth from the bottom surface of the cavity 115. The light guiding member 140 is formed on the inner ends 131A and 132A of the lead electrodes 131 and 131.

The inner ends 131A and 132A of the lead electrodes 131 and 131 may have the groove, for example, a reflective cup having a circular shape or a polygonal shape, but the shape of the reflective cup is not limited thereto.

Accordingly, light that is radiated through the light emitting structure 123 may be incident to the light guide member 140 via the substrate 121, pass through the light guide member 140, and be radiated through the outer side of the light emitting device 120. At this point, light incident to the light guide member 140 is reflected by the inner ends 131A and 132A of the lead electrodes 131 and 132.

Because the reflection angle of light that is reflected by the inner ends 131A and 132A of the lead electrodes 131 and 132 is changed by slope surfaces such as the side surfaces the groove, the reflected light may be radiated to the outside of the light emitting device 120. Accordingly, the light extraction efficiency of the light emitting device package 100H can be improved. Moreover, the light guide member 140 changes the critical angle of the reflected light, and thus can radiate the reflected light to the outside.

The package body 110 may be injection-molded and an upper portion 112A may be coupled to the package body 110 in a separate stacked structure.

Figure 12:
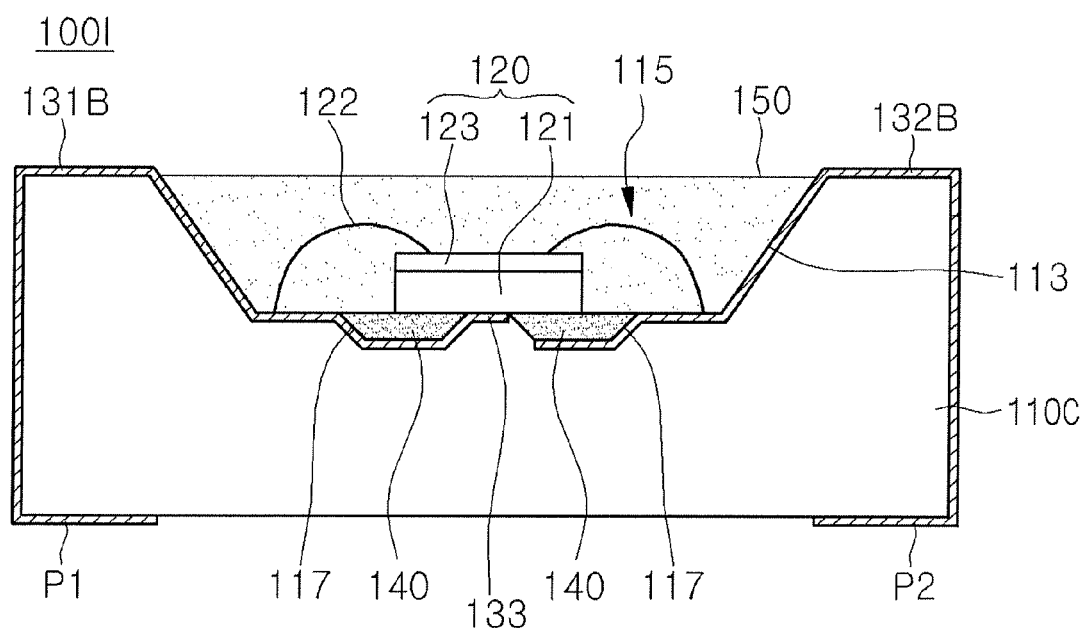
FIG. 12 is a side-sectional view illustrating a light emitting device package according to a tenth embodiment.

FIG. 12 is a side-sectional view illustrating a light emitting device package according to a tenth embodiment. In the description of the tenth embodiment, the same elements as those of the above embodiments will be indicated as the same reference numbers as those of the above embodiments, and repetitive description will be omitted.

Referring to FIG. 12, a light emitting device package 100I may include a package body 110C, and lead electrodes 131B and 132B having a groove 117.

The package body 110C has a cavity 115 having an opened upper side. An insulation layer such as $SiO_2$ is formed to a surface of the package body 110C. The insulation layer is disposed between the package body 110C and lead electrodes 131B and 132B.

The lead electrodes 131B and 132B may have a portion disposed within the cavity 115. The outer ends P1 and P2 of the lead electrodes 131B and 132B are disposed on the bottom surface of the package body 110C.

The groove 117 of the lead electrodes 131B and 132B may be formed to have a certain depth from the bottom surface of the cavity 115.

The groove 117 may be formed at the inner side of each of the lead electrodes 131B and 132B, but it is not limited thereto.

The light guide member 140 is formed at the groove 117. The light guide member 140 may be formed in a shape and a pattern corresponding to the groove 117.

The first lead electrode 131B is disposed on the other side surface of the package body 110C, and the second lead electrode 132B is disposed on one side surface of the package body 110C. The first lead electrode 131B is disposed along a bottom surface and a lateral surface of the cavity 115 and along an outer surface of the other side of the package body 110C to extend up to a portion of a bottom surface of the package body 110C.

The second lead electrode 132B is along a bottom surface and a lateral surface of the cavity 115 and along an outer surface of the one side of the package body 110C to extend up to a portion of a bottom surface of the package body 110C.

A mask pattern may be disposed on the first lead electrode 131B and the second lead electrode 132B to form a metal electrode layer using sputter equipment, but is not limited thereto.

The light emitting device 120 adheres to an adhesion part 133 of the first lead electrode 131B within the cavity 115 using an adhesive.

Figure 13:
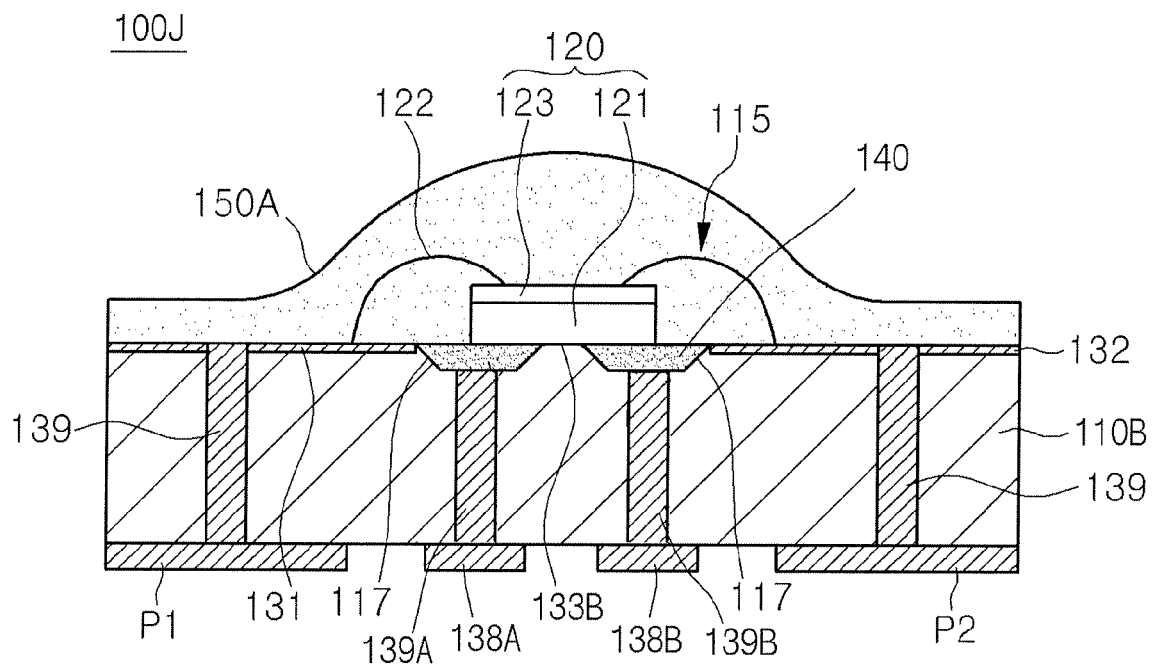
FIG. 13 is a side-sectional view illustrating a light emitting device package according to an eleventh embodiment.

FIG. 13 is a side-sectional view illustrating a light emitting device package according to an eleventh embodiment. In the description of the eleventh embodiment, the same elements as those of the above embodiments will be indicated as the same reference numbers as those of the above embodiments, and repetitive description will be omitted.

Referring to FIG. 13, a light emitting device package 100J may include through holes 139, 139A, and 139B, radiation plates 138A and 138B, and outer ends P1 and P2. The through holes 139A and 139B are connected to the light guide member 140 formed of Transparent Conducting Oxide (TCO)-based materials. The through holes 139A and 139B and the radiation plates 138A and 138B may be provided as an electrode.

The through holes 139A and 139B and the radiation plates 138A and 138B may be formed in one or plurality at the package body 110B.

A light emitting device 120 may be disposed on the adhesion part 133B using a package body 110 or an insulation layer.

Figure 14:
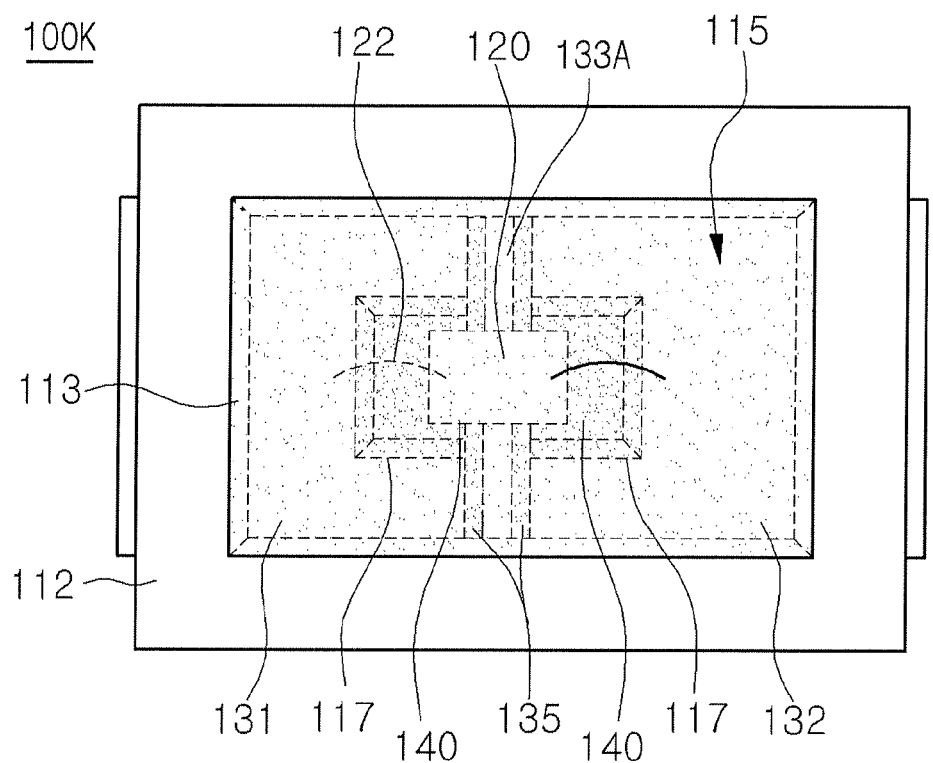
FIG. 14 is a plan view illustrating a light emitting device package according to a twelfth embodiment.

FIG. 14 is a plan view illustrating a light emitting device package according to a twelfth embodiment. In the description of the twelfth embodiment, the same elements as those of the above embodiments will be indicated as the same reference numbers as those of the above embodiments, and repetitive description will be omitted.

Referring to FIG. 14, a light emitting device package 100K may include an adhesion part 133A which is separated from lead electrodes 131 and 132. The adhesion part 133A may be disposed between two separation parts 135 having a dielectric material (for example, $SiO_2$).

Figure 15:
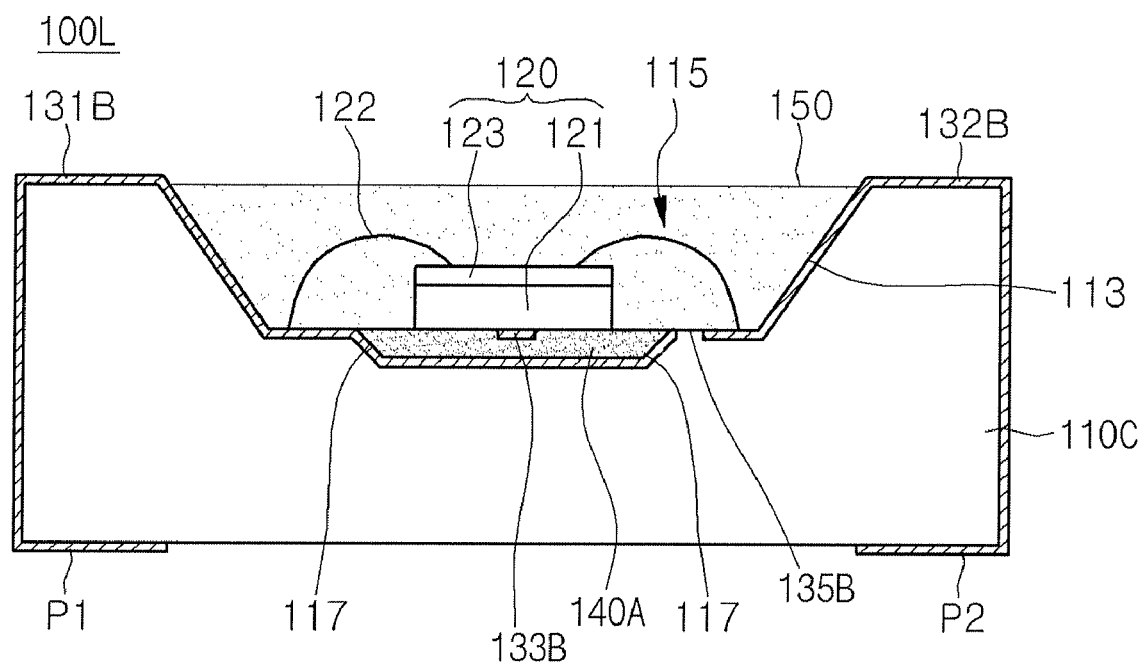
FIG. 15 is a side-sectional view illustrating a light emitting device package according to a thirteenth embodiment.

FIG. 15 is a side-sectional view illustrating a light emitting device package according to a thirteenth embodiment. In the description of the thirteenth embodiment, the same elements as those of the above embodiments will be indicated as the same reference numbers as those of the above embodiments, and repetitive description will be omitted.

Referring to FIG. 15, a light emitting device package 100L may include a light guide member 140A and adhesion part 133B on the light guide member 140A. The light guide member 140A may be disposed on one of the lead electrodes 131B and 132B. The light emitting member 140A is formed of a dielectric material (for example, $SiO_2$) or Transparent Conducting Oxide (TCO)-based materials. A separation part 135B is disposed at a side of the light guide member 140A and is formed in the package body 110C or an insulating layer. The light guide member 140A is disposed under perimeter of the light emitting device 120.

The adhesion part 133B is formed on the light guide member 140A and is formed of a metal material and/or an adhesion material. The adhesion part 133B is apart from the lead electrodes 131B and 132B.

The above-described first to thirteenth embodiments may be mixed with one another and thereby used. The technical characteristics of the above-disclosed first to eighth embodiments are not limited to the each embodiment, and may be applied to another embodiment. The light emitting device package according to embodiments may be disposed in an array type at the substrate of a cellular terminal or a notebook computer and thereby provided as a light unit, or may be variously applied to lighting devices and pointing devices.

An embodiment provides a method for manufacturing a light emitting device package that comprises forming at least one lead electrode on a package body; forming a light guide member comprising a light-transmitting material, at the package body; attaching a light emitting device on the at least one lead electrode and the light guide member; and electrically connecting the light emitting device to the at least one lead electrode.

According to embodiments, the light emitting device package and the method for manufacturing the same can improve light extraction efficiency.

According to embodiments, the light emitting device package and the method for manufacturing the same provide the high-efficiency package, resulting in the improvement of reliability for the package.

According to embodiments, the light emitting device package and the method for manufacturing the same can extract light, which travels to the lower portion of the light emitting device, to the outside.

Embodiments provide the light emitting device package in which light extraction efficiency is improved.

According to embodiments, the light emitting device package and the method for manufacturing the same can improve reliability for the light emitting device package.

Embodiments provide the light emitting device package which can be variously applied to cellular phones, notebook computers, lighting devices, pointing devices and the like.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
   a package body;
   a light emitting device on the package body; and
   a light-transmitting light guide member under the light emitting device,
   wherein the light-transmitting light guide member comprises a same light-transmitting material as a lower material of the light emitting device, or a light-transmitting material having a refraction index lower than a refraction index of the lower material of the light emitting device.

2. The light emitting device package according to claim 1, wherein one side of the light guide member is disposed at a bottom of the light emitting device, and another side of the light guide member is disposed at an outer side of the light emitting device.

3. The light emitting device package according to claim 1, wherein the package body comprises at least one groove in which the light guide member is formed.

4. The light emitting device package according to claim 3, wherein the groove comprises at least one of a circle shape, a polygon shape and a random shape.

5. The light emitting device package according to claim 1, further comprising:
   a plurality of lead electrodes electrically connected to the light emitting device,
   wherein the plurality of lead electrodes and the light emitting device are disposed in a cavity on the package body.

6. The light emitting device package according to claim 5, further comprising:
   a resin material on the light emitting device,
   wherein the light guide member is disposed in at east one groove in the package body at the cavity.

7. The light emitting device package according to claim 6, wherein a depth of the groove is greater than a thickness of the lead electrode.

8. The light emitting device package according to claim 5, wherein the light guide member comprises at least one of a slope side surface, a side surface and a roughness side surface.

9. The light emitting device package according to claim 1, wherein the light guide member comprises at least one of an oxide-based material, a polymer-based material, and a polymer compound material.

10. A light emitting device package, comprising:
    a package body;
    a light emitting device on the package body;
    at least one lead electrode electrically connected to the light emitting device;
    an adhesion part under the light emitting device; and
    a light guide member between one lead electrode of the at least one lead electrode and the adhesion part,
    wherein the light guide member comprises a same light-transmitting material as a lower material of the light emitting device, or a light-transmitting material having a refraction index lower than a refraction index of the lower material of the light emitting device.

11. The light emitting device package according to claim 10, further comprising a cavity formed on the package body; and a resin material in the cavity.

12. The light emitting device package according to claim 10, wherein the adhesion part is connected to the lead electrode.

13. The light emitting device package according to claim 10, wherein the adhesion part is disposed between the light guide member and the light emitting device.

14. The light emitting device package according to claim 10, wherein the light guide member is formed on the package body.

15. The light emitting device package according to claim 10, wherein the light emitting device comprises a light-transmitting substrate attached on the light guide member and/or the adhesion part.

16. The light emitting device package according to claim 10, wherein the light guide member comprises at least one of $SiO_2$, $Al_2O_3$, $TiO_2$, $TiO_3$, ZnO-based material, Transparent Conducting Oxide (TCO)-based material, and a glass material.

17. The light emitting device package according to claim 10, wherein one side of the light guide member is disposed at a lower portion of the light emitting device, and another side of the light guide member is disposed outside the light emitting device.

18. A light emitting device package, comprising:
    a package body comprising a cavity;
    a light emitting device at the cavity;
    at least one lead electrode under the light emitting device; and
    a light guide member disposed under perimeter of the light emitting device,
    wherein the light guide member comprises a same light-transmitting material as a lower material of the light emitting device, or a material having a small refraction index difference with the lower material of the light emitting device.

19. The light emitting device package according to claim 18, wherein the light guide member is disposed at a groove at the bottom of the cavity.

* * * * *